(12) United States Patent
Perner

(10) Patent No.: US 6,731,552 B2
(45) Date of Patent: May 4, 2004

(54) INTEGRATED DYNAMIC MEMORY AND OPERATING METHOD

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 10/206,299

(22) Filed: Jul. 26, 2002

(65) Prior Publication Data

US 2003/0021170 A1 Jan. 30, 2003

(30) Foreign Application Priority Data

Jul. 26, 2001 (DE) .......................................... 101 36 544

(51) Int. Cl.$^7$ ................................................ G11C 7/00
(52) U.S. Cl. ........................ 365/201; 365/222; 365/200
(58) Field of Search ................................. 365/201, 222, 365/230.03, 149, 200

(56) References Cited

U.S. PATENT DOCUMENTS

| | | | | |
|---|---|---|---|---|
| 5,808,952 A | * | 9/1998 | Fung et al. .................. | 365/222 |
| 6,141,280 A | | 10/2000 | Cho ............................ | 365/222 |
| 6,381,188 B1 | * | 4/2002 | Choi et al. .................. | 365/222 |
| 6,529,433 B2 | * | 3/2003 | Choi ........................... | 365/222 |
| 6,570,802 B2 | * | 5/2003 | Ohtsuka et al. ............. | 365/222 |

* cited by examiner

*Primary Examiner*—Anh Phung
(74) *Attorney, Agent, or Firm*—Laurence A. Greenberg; Werner H. Stemer; Gregory L. Mayback

(57) ABSTRACT

An integrated dynamic memory includes a memory cell array having memory cells for storing a charge corresponding to an information bit. The memory cell array has a regular cell area with regular memory cells, a first test cell area with first test cells and a second test cell area with second test cells. A control unit is provided for refreshing the charge contents of the regular memory cells with a first refresh time, a control unit is provided for refreshing the charge contents of the first test cells with a second refresh time, and the charge contents of the second test cells with a third refresh time. The first refresh time is shorter than the second refresh time and the latter is shorter than the third refresh time. An evaluation unit is provided for detecting memory cell defects in the first and second test cell areas.

18 Claims, 1 Drawing Sheet

INTEGRATED DYNAMIC MEMORY AND OPERATING METHOD

BACKGROUND OF THE INVENTION

Field of the Invention

The invention relates to an integrated dynamic memory having a memory cell array with memory cells for storing a charge corresponding to an information bit. The invention further relates to a method for operating an integrated memory of this type.

Integrated memories, such as, for example, a dynamic random access memory (DRAM) use capacitors for storing charge. The charge state in the capacitor in each case represents an information bit.

A DRAM chip contains a matrix of memory cells that are arranged in rows and columns and that are addressed by word lines and bit lines. Reading data from the memory cells or writing data to the memory cells is realized by activating suitable word lines and bit lines.

The charge stored in the capacitor decreases over time on account of recombination and leakage currents. Before the charge has decreased to an indeterminate level below a specific threshold value, the capacitor charge must be refreshed. This operation is referred to as "refresh". For this reason, these memory cells are called dynamic RAM (DRAM), in contrast to static RAMs (SRAM), which do not need refreshing.

The term retention time refers to that period of time for which a memory cell of a DRAM can retain the stored charge without falling below the threshold value. The refresh time, specifically the time between two refresh operations, must therefore be equal to or shorter than the retention time so that data losses do not occur.

The refreshing of the storage capacitors is generally controlled by an external module, for instance, the controller of a PC (Personal Computer) for all of the installed memory modules. If the memory modules have different refresh times, the weakest module with the shortest refresh time determines the refresh cycle for all of the modules. A refresh that is as infrequent as possible, that is to say a long refresh time, is advantageous since first the memory module is blocked during the refresh and is not available for other tasks, and second every refresh is associated with a charge transport and thus a current consumption. This has a disadvantageous effect particularly in the case of portable devices, whose rechargeable-battery operating time is critical.

A general problem in the case of the retention time of a semiconductor memory is due to the fact that the retention time is not an invariable constant, but rather can depend on the ambient and operating temperature, and also on the age of the module.

At the present time, this circumstance is taken into account by assuming a maximum operating temperature, for example 95°, which is composed for instance of a maximum specified external temperature of 70° C. and an inherent heating proportion of 25° C. The memory modules are then tested at this temperature and memory cells which did not satisfy the specification are replaced by redundant memory cells, or the refresh time is set so conservatively at delivery that the remaining memory cells have a retention time above the chosen refresh time up to the maximum temperature.

For a 128 Mbit memory module having 4096 rows, 64 ms, for example, is generally chosen as the refresh time. The chip is tested at the maximum operating temperature at 64 ms and the weak cells are eliminated in a customary manner by redundancy repairs. After a successful test of a module, it is then assumed that:

the retention time was set correctly by fuses/trimmer;

the retention is identical for volatile logic ones ("1") and logic zeros ("0");

the defective cells have been eliminated by redundancy activation;

the inherent chip heating does not increase in operation throughout the lifetime of the product;

the retention susceptibility does not increase or vary with respect to time, as in the case of the so-called "variable retention time";

the actually tested temperature at which the retention time was determined is known precisely.

These expectations for the most part represent simplified assumptions which, when not completely applicable, are compensated for, for example, by overtesting after production. Alternatively, these assumptions can lead to failures after a certain operating duration. This loss is unacceptable in particular in the case of high-reliability components, for example, in mainframe computers, in power station control and the like.

SUMMARY OF THE INVENTION

It is accordingly an object of the invention to provide an integrated dynamic memory which overcomes the above-mentioned disadvantages of the prior art apparatus of this general type.

In particular, it is an object of the invention to provide an integrated dynamic memory that when compared with conventional dynamic memories, has a small current consumption and/or is available for random read/write accesses for the longest possible proportion of time.

With the foregoing and other objects in view there is provided, in accordance with the invention, an integrated dynamic memory including a memory cell array having a regular cell area with regular memory cells, a first test cell area with first test cells, and a second test cell area with second test cells. The regular memory cells, the first test cells and the second test cells are for storing a charge corresponding to an information bit. The integrated dynamic memory also includes: a control unit for refreshing charge contents of the regular memory cells with a first refresh time $T_{ref}$; a control unit for refreshing charge contents of the first test cells with a second refresh time T1, and for refreshing charge contents of the second test cells with a third refresh time T2; and an evaluation unit for detecting memory cell defects in the first test cell area and in the second test cell area. The first refresh time $T_{ref}$ is shorter than the second refresh time T1; and the second refresh time T1 is shorter than the third refresh time T2.

The invention is thus based on the concept of functionally separating subareas of the memory cell array from the regular memory area and using them for monitoring and analyzing the retention time that is presently required. In this case, the invention assumes that the cells used for the retention analysis have the same production-dictated retention quality as the regular memory cell array and the underlying statistics are not significantly impaired by the limited number of cells used for the analysis.

Both assumptions are generally satisfied well, since the cell areas used for the retention analysis originate from the same memory cell array as the regular memory cells.

Moreover, after the redundancy activation, there are generally still sufficiently many redundant memory cells available which can be utilized for the retention analysis with adequate statistics.

Preferably, the evaluation unit has a device for altering the refresh times $T_{ref}$, T1 and T2 on the basis of detected memory cell defects. This makes it possible to adapt the refresh time $T_{ref}$ to instantaneous conditions depending on the result of the memory tests carried out on the test cell areas, that is to say to increase or decrease the refresh time $T_{ref}$. In this case, operation is carried out with a longer refresh time T1 in the first test cell area, and operation is carried out with an even longer refresh time T2 in the second test cell area.

If the evaluation of the memory test reveals that no memory cell defects occurred even at the longer refresh times T1 and T2, it can be concluded that the present operating conditions according to the temperature and the age of the module also permit the regular memory cells to be used with a longer refresh time $T_{ref}$ than presently set.

The refresh times $T_{ref}$, T1 and T2 are expediently chosen such that the refresh time T1 is twice as long as $T_{ref}$, and the refresh time T2 is twice as long as T1. The refresh time of the first test cell area thus differs by the factor 2, and that of the second test cell area by the factor 4, from the present setting for the regular memory areas.

This enables a reliable assessment of the appropriate refresh rate: this is because if the first memory cell area runs with the refresh time T1 without any memory defects, it can be concluded that the present, shorter refresh time $T_{ref}$ is in defect-free operation even with some safety margin. The first test cell area thus functions as a safety area whose defectless or defective operation allows conclusions about the operating state of the regular memory area.

As described in detail further below, the defect assessments of the first and second test cell areas together can be used not only to infer whether the regular memory cell area operates reliably, but also to determine the corrections that are necessary, if appropriate.

In a preferred refinement, the memory cell array of the integrated memory is organized in row lines and column lines and the regular cell area, the first test cell area and the second test cell area in each case include a number of row lines.

In this case, the row lines of the first and/or second cell area may be arranged next to one another at the edge of the regular memory cell area, or may be arranged between the row lines of the regular memory cell area. The first variant allows for simple access to the test cell areas arranged in a block-like manner, while in the second variant, it is ensured by the arrangement of the test cell rows between the regular memory cell rows in a particular manner that the test cell rows experience the same operating conditions and have the same physical properties as the regular memory cells. The retention behavior of the test cells is thus a true reflection of the retention behavior of the regular memory cells.

With the foregoing and other objects in view there is provided, in accordance with the invention, a method for operating the described integrated dynamic memory, which includes steps of: providing the integrated dynamic memory with a memory cell array having a regular cell area with regular memory cells, a first test cell area with first test cells, and a second test cell area with second test cells; providing the regular memory cells, the first test cells and the second test cells for storing a charge corresponding to an information bit; refreshing charge contents of the regular memory cells with a first refresh time $T_{ref}$; writing test patterns to the first test cells and to the second test cells; refreshing charge contents of the first test cells with a second refresh time T1, and refreshing charge contents of the second test cells with a third refresh time T2; providing the first refresh time $T_{ref}$ being shorter than the second refresh time T2 and providing the second refresh time T2 being shorter than the third refresh time $T_{ref}$; reading memory cell contents of the first test cell area and the second test cell area and detecting memory cell defects by comparing the memory cell contents with the test patterns that were written to the first test cells and to the second test cells; and checking the first refresh time $T_{ref}$ with regard to the memory cell defects that were detected in the first test cell area and in the second test cell area.

Preferably, in the method, after checking the first refresh time $T_{ref}$ with regard to detected memory cell defects:

the first refresh time $T_{ref}$ is lengthened, or is left unchanged after reaching a maximum refresh time $T_{max}$ if no memory cell defects are detected in the first and second test areas;

the first refresh time $T_{ref}$ is shortened, or is left unchanged after reaching a minimum refresh time $T_{min}$ if memory cell defects are detected in both the first and the second test areas; and otherwise the first refresh time $T_{ref}$ is left unchanged.

In an expedient manner, after the first refresh time $T_{ref}$ is changed, the second and third refresh times of the test cell areas are correspondingly adapted. In particular, in the event of lengthening the first refresh time $T_{ref}$, the second and third refresh times T1, T2 are lengthened, so that the first refresh time $T_{ref}$ is shorter than the second refresh time T1 and the second refresh time T1 is shorter than the third refresh time T2.

Equally, in the event of shortening the first refresh time $T_{ref}$, the second and third refresh times T1, T2 are shortened, so that the first refresh time $T_{ref}$ is shorter than the second refresh time T1 and the second refresh time T1 is shorter than the third refresh time T2.

The operating method can then proceed as described above, only with changed refresh times. The refresh times can, of course, also be changed repeatedly one after the other or with a time interval, in order, for instance, to take account of further heating or cooling of the module.

Preferably, the refresh times $T_{ref}$, T1 and T2 are doubled in the case of lengthening, and are halved in the case of shortening.

By way of example, the refresh times $T_{ref}$, T1 and T2 may assume a value from the group 1 ms, 2 ms, 4 ms, 8 ms, 16 ms, 32 ms, 64 ms, 128 ms, 256 ms, 512 ms, 1024 ms, 2048 ms and 4096 ms. The minimum refresh time $T_{min}$ is then 1 ms and the maximum refresh time $T_{max}$ for the regular memory cells is 1024 ms. Of course, other values are also appropriate for the refresh times depending on the application and complexity of the memory module.

It is useful for the defect analysis if, in the event of memory cell defects being detected, the type of memory cell defects is ascertained, in particular whether only logic zeros, only logic ones, or both have failed.

During the operation of a plurality of the integrated dynamic memory modules described, the following method steps are carried out:

for each of the integrated memory modules, in response to a request signal from an external controller, the refresh time $T_{ref}$ thereof is determined and communicated to the controller;

the controller determines the shortest of the refresh times; and the shortest refresh time that has been determined is subsequently used for refreshing each of the plurality of memory modules.

In a refinement of this method, for each of the integrated memory modules, the refresh times T1 and T2 of the first and second test cells are continually determined and stored in registers. The refresh times T1, T2 of all of the memory modules are read out by an external controller, and the controller decides, on the basis of the read out refresh times T1, T2, about outputting a request signal for determining the refresh times $T_{ref}$ of the memory modules.

In the self-refresh mode, by contrast, each memory module can execute its refresh mode without external control according to its own refresh time $T_{ref}$, even if this refresh time differs from the refresh time of the other installed memory modules.

Other features which are considered as characteristic for the invention are set forth in the appended claims.

Although the invention is illustrated and described herein as embodied in an integrated dynamic memory and operating method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
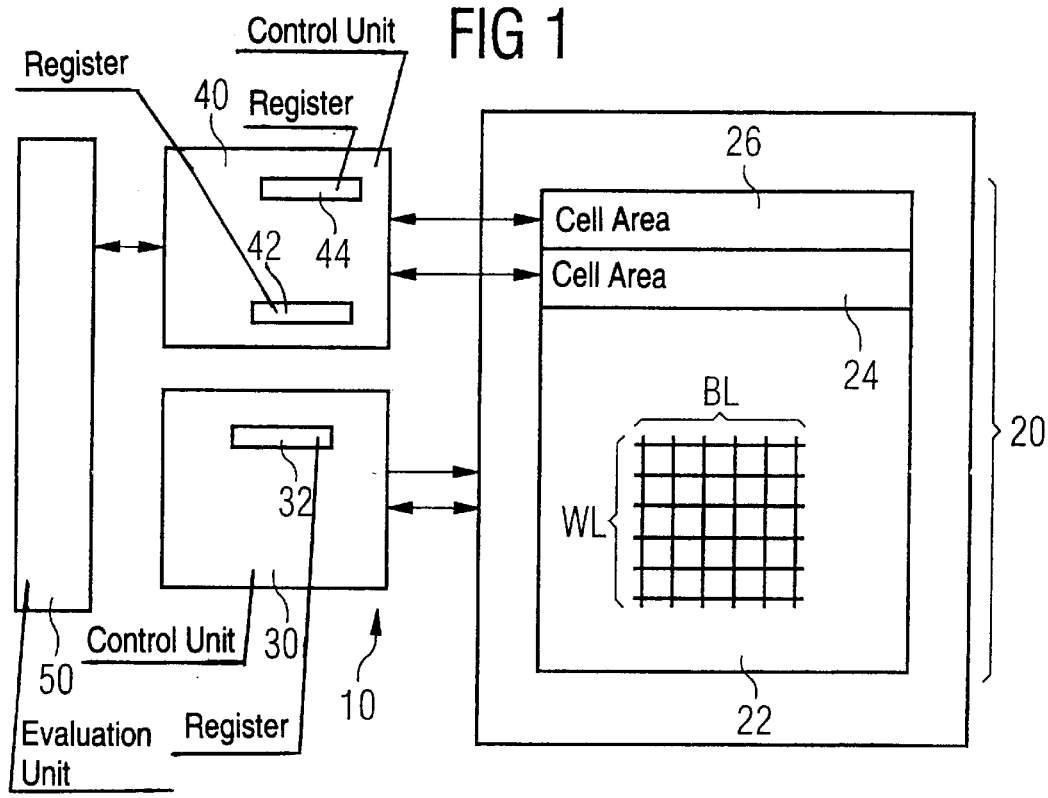
FIG. 1 diagrammatically shows an exemplary embodiment of an inventive integrated dynamic memory.

Referring now to the figures of the drawing in detail and first, particularly, to FIG. 1 thereof, there is shown a block diagram of an exemplary embodiment of an inventive integrated dynamic memory, which is in this case a 128 Mbit DRAM 10. The memory module 10 contains a memory block 20 containing an array 22 of regular memory cells including 4096 regular row lines WL and 512 regular column lines BL.

In addition, the memory block 20 includes redundant memory cells, of which two cell areas 24, 26 are also available after the redundancy activation. In the exemplary embodiment, each of the cell areas 24, 26 contains forty-eight row lines WL, but this number can vary depending on the number of cells required for the repair.

The memory cells of the regular memory area 22 serve for the standard writing and reading of data. The cell areas 24 and 26 function as test areas in which the memory cells are in each case refreshed with a rate that deviates from the regular memory area.

To that end, the memory block 20 is connected to a control unit 30, which first refreshes the charge contents of the regular memory cells in a refresh cycle of $T_{ref}$=64 ms. The control unit 30 also carries out, in a manner known per se, read/write accesses to the regular memory area 22, for example, the control unit 30 applies addresses and writes or reads data from the memory block 20.

A further control unit 40 serves for addressing the test cell areas 24 and 26. The memory cells of the first test cell area 24 are first refreshed with a refresh time of T1=128 ms, and those of the second test cell area 26 with a refresh time of T2=256 ms.

The control unit 40 then writes test patterns, specific sequences of logic 1s and 0s, to the test cell areas 24, 26, reads the stored patterns out again after the respective refresh time has elapsed, and compares them with the stored pattern. If no deviations are evident, the memory test is deemed to have been passed (PASS), and otherwise to have been failed (FAIL).

In the case of a failed test, for the defect analysis it is additionally ascertained whether the defects occurred only in those cells containing logic ones, whether the defects occurred only in those cells containing logic zeros, or whether both types of defect occur.

The result of the memory test is evaluated in an evaluation unit 50. In this case, four different test results are possible, which result in different further measures:

a) The memory test in the first test cell array 24 with T1=128 ms yields PASS and the memory test in the second test cell array 26 with T2=256 ms yields FAIL (for short: PASS/FAIL). In this case, the present refresh time $T_{ref}$=64 ms is considered to be appropriate since the first test cell array with its longer (doubled) refresh time still does not produce any defects, but the refresh with the significantly longer (quadrupled) refresh time in the second test cell array leads to memory defects. As a consequence, no change is made to the refresh time $T_{ref}$ of the regular memory cells.

b) The memory test yields no defects in both test cell arrays with T1=128 ms and with T2=256 ms (PASS/PASS). In this case, the present refresh time $T_{ref}$=64 ms can be lengthened to 128 ms since no memory defects occur at the latter time, nor at the even longer refresh time of the second test cell array.

As a consequence, the refresh time $T_{ref}$ is doubled to 128 ms. For further testing, the refresh times of the test cell arrays must also be adapted. T1 is doubled to 256 ms, and T2 to 512 ms, and the method is continued with the new refresh times. If only defect-free test results are again yielded, the refresh time can be increased further.

c) The memory test yields memory cell defects in both test cell arrays with T1=128 ms and with T2=256 ms (FAIL/FAIL). In this case, the present refresh time $T_{ref}$=64 ms is classified as too long.

As a consequence, the refresh time $T_{ref}$ is halved to 32 ms. For further testing, the refresh times of the test cell arrays must also be adapted. T1 is reduced to 64 ms, and T2 to 128 ms, and the method is continued with the new refresh times. If only defective test results are yielded again, the refresh time must be lowered further.

d) The memory test in the first test cell array 24 with T1=128 ms yields FAIL and the memory test in the second test cell array 26 with T2=256 ms yields pass (FAIL/PASS). This case should not occur in normal operation and is treated, if appropriate, as a unique isolated case. All of the refresh times remain unchanged.

The regular memory cells thus always run with a refresh rate in the reliable range since, during operation in the settled state, even the test cell array with a refresh time twice as long still does not yield any memory cell defects.

If the refresh time $T_{ref}$ reaches a predetermined maximum value $T_{max}$, for example 1024 ms or 4096 ms, no further increase takes place, even if both test cell arrays run PASS. This allows the use of a register with a predetermined width for controlling the refresh time.

Furthermore, no further reduction of $T_{ref}$ takes place if a predetermined minimum value $T_{min}$, for example, 1 ms has been reached, even if both test cell arrays yield FAIL. This takes account of the fact that excessively short refresh times are not expedient.

The test results and the measures provided are compiled in abbreviated fashion in table 1.

TABLE 1

| Result 1 (T1) | Result 2 (T2) | Measure |
|---|---|---|
| PASS | FAIL | Normal case: no change |
| PASS | PASS | if $T_{ref} < T_{max}$: double $T_{ref}$, T1, T2 |
| FAIL | FAIL | if $T_{ref} > T_{min}$: halve $T_{ref}$, T1, T2 |
| FAIL | PASS | should not occur: no change |

Figure 2:
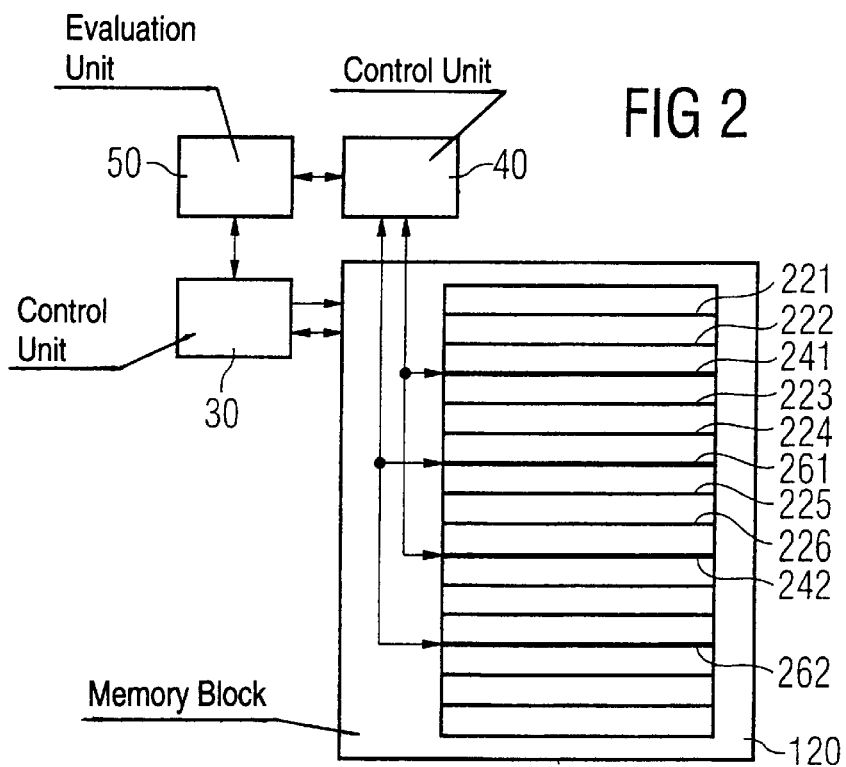
FIG. 2 diagrammatically shows a further exemplary embodiment of an inventive integrated dynamic memory.

A further exemplary embodiment of an integrated memory is illustrated in FIG. 2, where there is also a logical assignment of the row lines of the memory block 120 to the regular memory area and the first and second test cell areas.

However, in this embodiment, the row lines which are logically associated with the different areas are not physically arranged in a blockwise manner, but rather are intermixed. Thus, the row lines 221–226 are part of the regular memory area, the row lines 241, 242 are part of the first test cell area, and the row lines 261, 262 are part of the second test cell area. FIG. 2 shows only a small number of row lines, for the sake of clarity. In practice, the number is significantly larger; by way of example, a 128 Mbit DRAM chip may include 4096 regular row lines and in each case 48 row lines in the two test cell areas. The arrangement scheme illustrated in FIG. 2 can also be maintained, in principle, with the higher number of rows.

An intermixed arrangement as in FIG. 2 has the additional advantage that the test row lines have the same average temperature as the regular row lines. Consequently, the retention behavior of the test cells represents a true reflection of the behavior of the regular memory cells.

In the case of an intermixed arrangement, it is necessary, of course, that the control unit 40 and the control unit 30 keep a record of the addresses of the test rows 241, 242, 261, 262 in the memory block 120 in order to avoid incorrect accesses.

In order to perform the retention analysis, in the exemplary embodiment, a register 32, 42, 44 of sufficiently high resolution is in each case used for the two test cell arrays and the regular memory cell array. The binary value of the register in each case specifies the refresh time of the relevant cell area in milliseconds. By way of example, the register of the regular memory area 32 contains, after system initialization, the binary value "0000001000000", for 64 ms, the register 42 of the first test cell area contains the binary value "0000010000000" for 128 ms, and the register 44 of the second test cell area contains the binary value "0000100000000" for 256 ms. The twelve-bit-wide registers allow refresh values up to 212 (212=4096 ms).

Depending on the result of the test cell analysis, all the registers 32, 42, 44 are shifted by one bit toward the left or right, which corresponds to a doubling or a halving of the associated refresh time. In this case, before the bit shift, a check is made to determine whether the maximum values have been reached, that is to say, in the case of lengthening, whether the refresh time $T_{ref}$ is already 1024 ms, and in the case of a reduction, whether it is already 1 ms. The refresh times remain unchanged in both cases.

Overall, the memory module can thus react to altered external influences by adapting the refresh time. The memory module is thereby independent of operating and aging conditions.

During the operation of a plurality of such memory modules, the connected controller has the possibility, in the so-called auto-refresh operating mode, of accessing the individual refresh timer values and of adapting its refresh rate to the worst (that is to say shortest) refresh time. To that end, the controller can send a request signal to the memory modules which drive the individual values of $T_{ref}$ from the module. The shortest refresh time can then be determined, which is subsequently used for the refresh of each of the memory modules.

The refresh times T1 and T2 are either determined once individually in the sense of a measurement request, or are determined permanently independently of the refresh time $T_{ref}$ and are stored in respective control registers.

In the so-called self-refresh operating mode, T1 and T2 must be determined permanently, and each module of a group of modules is able to follow its own refresh time $T_{ref,i}$.

I claim:

1. An integrated dynamic memory, comprising:
   a memory cell array having a regular cell area with regular memory cells, a first test cell area with first test cells, and a second test cell area with second test cells, said regular memory cells, said first test cells and said second test cells being for storing a charge corresponding to an information bit;
   a control unit for refreshing charge contents of said regular memory cells with a first refresh time;
   a control unit for refreshing charge contents of said first test cells with a second refresh time, and for refreshing charge contents of said second test cells with a third refresh time; and
   an evaluation unit for detecting memory cell defects in said first test cell area and in said second test cell area;
   said first refresh time being shorter than said second refresh time; and
   said second refresh time being shorter than said third refresh time.

2. The integrated dynamic memory according to claim 1, wherein: said evaluation unit includes a device for altering said first refresh time, said second refresh time, and said third refresh time based on said memory cell defects that were detected.

3. The integrated dynamic memory according to claim 1, wherein: said second refresh time is twice as long as said first refresh time, and said third refresh time is twice as long as said second refresh time.

4. The integrated dynamic memory according to claim 1, wherein:
   said memory cell array is organized in row lines and column lines; and
   said regular cell area includes a plurality of said row lines;
   said first test cell area includes a plurality of said row lines; and
   said second test cell area includes a plurality of said row lines.

5. The integrated dynamic memory according to claim 4, wherein:

said regular memory cell area has an edge; and said plurality of said row lines of said first test cell area are configured next to one another at said edge of said regular memory cell area.

6. The integrated dynamic memory according to claim 4, wherein:

said regular memory cell area has an edge; and said plurality of said row lines of said second test cell area are configured next to one another at said edge of said regular memory cell area.

7. The integrated dynamic memory according to claim 4, wherein:

said plurality of said row lines of said first test cell area are configured between said plurality of said row lines of said regular memory cell area.

8. The integrated dynamic memory according to claim 4, wherein:

said plurality of said row lines of said second test cell area are configured between said plurality of said row lines of said regular memory cell area.

9. A method for operating an integrated dynamic memory, which comprises:

providing the integrated dynamic memory with a memory cell array having a regular cell area with regular memory cells, a first test cell area with first test cells, and a second test cell area with second test cells;

providing the regular memory cells, the first test cells and the second test cells for storing a charge corresponding to an information bit;

refreshing charge contents of the regular memory cells with a first refresh time;

writing test patterns to the first test cells and to the second test cells;

refreshing charge contents of the first test cells with a second refresh time, and refreshing charge contents of the second test cells with a third refresh time;

providing the first refresh time being shorter than the second refresh time and providing the second refresh time being shorter than the third refresh time;

reading memory cell contents of the first test cell area and the second test cell area and detecting memory cell defects by comparing the memory cell contents with the test patterns that were written to the first test cells and to the second test cells; and checking the first refresh time with regard to the memory cell defects that were detected in the first test cell area and in the second test cell area.

10. The method for operating an integrated dynamic memory according to claim 9, which comprises:

after the checking of the first refresh time:

if no memory cell defects are detected in the first test cell area and in the second test cell area and if a maximum refresh time has not been reached, then lengthening the first refresh time, however, leaving the first refresh time unchanged after reaching the maximum refresh time;

if memory cell defects are detected in both the first test cell area and the second test cell area and if a minimum refresh time has not been reached, then shortening the first refresh time, however, leaving the first refresh time unchanged after reaching the minimum refresh time; and otherwise leaving the first refresh time unchanged.

11. The method for operating an integrated dynamic memory according to claim 10, which comprises:

when the first refresh time is being lengthened, lengthening the second refresh time and the third refresh time so that the first refresh time is shorter than the second refresh time and the second refresh time is shorter than the third refresh time.

12. The method for operating an integrated dynamic memory according to claim 10, which comprises:

when the first refresh time is being shortened, shortening the second refresh time and the third refresh time so that the first refresh time is shorter than the second refresh time and the second refresh time is shorter than the third refresh time.

13. The method for operating an integrated dynamic memory according to claim 10, which comprises:

when the first refresh time is being lengthened, doubling the first refresh time, the second refresh time, and the third refresh time; and when the first refresh time is being shortened, halving the first refresh time, the second refresh time, and the third refresh time.

14. The method for operating an integrated dynamic memory according to claim 9, wherein:

the first refresh time, the second refresh time, and the third refresh time each assume a value selected from a group consisting of 1 ms, 2 ms, 4 ms, 8 ms, 16 ms, 32 ms, 64 ms, 128 ms, 256 ms, 512 ms, 1024 ms, 2048 ms, and 4096 ms.

15. The method for operating an integrated dynamic memory according to claim 9, which comprises:

performing a defect analysis when the memory cell defects are detected by ascertaining a type of the memory cell defects.

16. The method for operating an integrated dynamic memory according to claim 9, which comprises:

performing a defect analysis when the memory cell defects are detected by ascertaining a failure state selected from a group consisting of a failure of only logic zeros, a failure of only logic ones, and a failure of both logic ones and logic zeros.

17. A method for operating a plurality of integrated dynamic memory modules, which comprises:

providing each one of the plurality of the integrated dynamic memory modules with:

a memory cell array having a regular cell area with regular memory cells, a first test cell area with first test cells, and a second test cell area with second test cells, the regular memory cells, the first test cells and the second test cells being for storing a charge corresponding to an information bit;

a control unit for refreshing charge contents of the regular memory cells with a first refresh time;

a control unit for refreshing charge contents of the first test cells with a second refresh time, and for refreshing charge contents of the second test cells with a third refresh time; and an evaluation unit for detecting memory cell defects in the first test cell area and in the second test cell area;

the first refresh time being shorter than the second refresh time; and the second refresh time being shorter than the third refresh time;

for each one of the plurality of the integrated dynamic memory modules, in response to a request signal from an external controller, determining the first refresh time and communicating the first refresh time to the controller; using the controller to determine a shortest refresh time selected from a group consisting of the first refresh time, the second refresh time, and the third refresh time; and subsequently using the shortest refresh time for refreshing each one of the plurality of the integrated dynamic memory modules.

18. The method according to claim 17, which comprises:

for each one of the plurality of the integrated dynamic memory modules, continuously determining the second refresh time and the third refresh time and storing the second refresh time and the third refresh time in registers;

using the controller to read out the second refresh time and the third refresh time of all of the plurality of the integrated dynamic memory modules; and using the controller to, based on the second refresh time and the third refresh time of all of the plurality of the integrated dynamic memory modules, decide whether to output a request signal for determining the first refresh time of each one of the plurality of the integrated dynamic memory modules.

* * * * *